(12) United States Patent
Cha

(10) Patent No.: US 10,147,731 B2
(45) Date of Patent: Dec. 4, 2018

(54) SEMICONDUCTOR DEVICE

(71) Applicant: SK hynix Inc., Gyeonggi-do (KR)

(72) Inventor: Jae Yong Cha, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/708,885

(22) Filed: Sep. 19, 2017

(65) Prior Publication Data

US 2018/0006047 A1 Jan. 4, 2018

Related U.S. Application Data

(62) Division of application No. 14/453,219, filed on Aug. 6, 2014.

(30) Foreign Application Priority Data

Mar. 17, 2014 (KR) .................. 10-2014-0031042

(51) Int. Cl.
| | |
|---|---|
| *H01L 27/115* | (2017.01) |
| *H01L 27/1157* | (2017.01) |
| *H01L 27/11524* | (2017.01) |
| *H01L 27/11556* | (2017.01) |
| *H01L 27/11582* | (2017.01) |
| *G11C 16/04* | (2006.01) |

(Continued)

(52) U.S. Cl.
CPC .... *H01L 27/11524* (2013.01); *G11C 16/0483* (2013.01); *G11C 16/24* (2013.01); *H01L 27/1157* (2013.01); *H01L 27/11556* (2013.01); *H01L 27/11582* (2013.01)

(58) Field of Classification Search
CPC ......... H01L 27/11582; H01L 27/11556; H01L 27/1157; H01L 27/11524; H01L 27/11529; H01L 27/11565; H01L 27/11578; H01L 27/11519; H01L 27/11551; H01L 2924/0002; H01L 2924/145–2924/1451; H01L 29/4234–29/42352; H01L 29/66825–29/66833; H01L 29/788; H01L 29/792–29/7926; H01L 21/76802; H01L 21/76816; H01L 21/76877; H01L 21/8221; H01L 23/5226; H01L 27/11521; H01L 27/11531; H01L 27/11568; H01L 27/115–27/11597; G11C 16/0483; G11C 16/24
USPC ........ 438/278, 448, 589, 510, 261; 257/314, 257/324, E29.309, E21.423
See application file for complete search history.

(56) References Cited

U.S. PATENT DOCUMENTS

| | | | |
|---|---|---|---|
| 2010/0202206 A1* | 8/2010 | Seol .................. | G11C 16/0408 365/185.17 |
| 2012/0314514 A1* | 12/2012 | Kwon ...................... | G11C 7/18 365/189.09 |

* cited by examiner

*Primary Examiner* — Natalia Gondarenko
(74) *Attorney, Agent, or Firm* — IP & T Group LLP

(57) ABSTRACT

A semiconductor device includes a common source region formed in a semiconductor substrate, a bit line formed over the semiconductor substrate, first and second vertical channel layers coupled between the bit line and the common source region, wherein the first and second vertical channel layers are alternately arranged on the semiconductor substrate, first conductive layers stacked over the semiconductor substrate to surround one side of the first vertical channel layer, second conductive layers stacked over the semiconductor substrate to surround one side of the second vertical channel layer, and a charge storage layer formed between the first vertical channel layer and the first conductive layers and between the second vertical channel layer and the second conductive layers.

5 Claims, 13 Drawing Sheets

(51) Int. Cl.
*G11C 16/24* (2006.01)
*H01L 29/788* (2006.01)

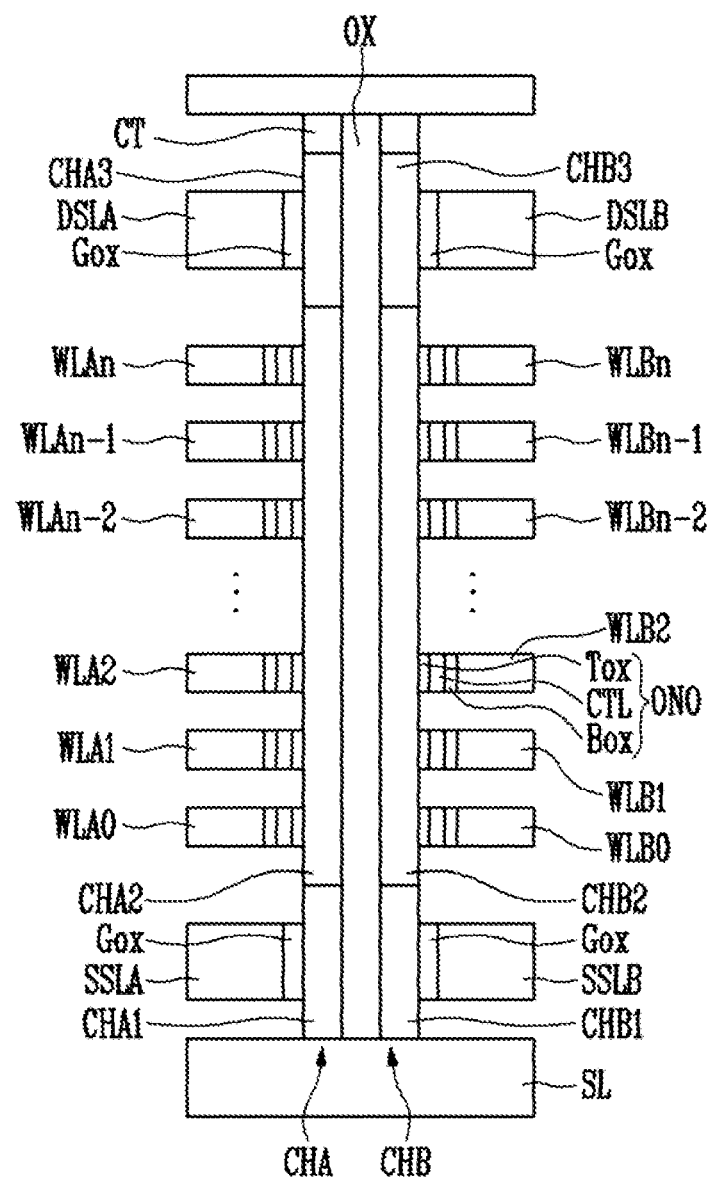

SEMICONDUCTOR DEVICE

CROSS-REFERENCE TO RELATED APPLICATION

This application is a division of U.S. patent application Ser. No. 14/453,219, filed on Aug. 6, 2014, which claims priority to Korean patent application number 10-2014-0031042, filed on Mar. 17, 2014, in the Korean Intellectual Property Office. The disclosure of each of the foregoing applications is incorporated herein by reference in its entirety.

BACKGROUND

1. Technical Field

Various embodiments of the present invention relate generally to a semiconductor device and, more particularly, to a semiconductor device including a memory cell.

2. Related Art

To form more memory cells within a predetermined area, three-dimensional structure of memory strings (or memory blocks) having memory cells vertically stacked over substrates have been developed. In addition, more research is being conducted on three-dimensional structures of memory blocks allowing more memory cells to fit within a predetermined area.

BRIEF SUMMARY

Various embodiments of the present invention relate to a semiconductor device capable of forming more memory cells within a predetermined area.

A semiconductor device according to an embodiment of the present invention may include a common source region formed in a semiconductor substrate, a bit line formed over the semiconductor substrate, first and second vertical channel layers coupled between the bit line and the common source region, wherein the first and second vertical channel layers are alternately arranged on the semiconductor substrate, first stacked conductive layers stacked over the semiconductor substrate to surround one side of the first vertical channel layer, second stacked conductive layers stacked over the semiconductor substrate to surround one side of the second vertical channel layer, and a charge storage layer formed between the first vertical channel layer and the first stacked conductive layers and between the second vertical channel layer and the second stacked conductive layers.

A semiconductor device according to an embodiment of the present invention may include first and second vertical channel layers vertically coupled between a semiconductor substrate and a bit line, third and fourth vertical channel layers vertically coupled between the semiconductor substrate and a common source line, first and second multilayer conductive layers stacked over the semiconductor substrate to surround one side of the first vertical channel layer and one side of the second vertical channel layer, respectively, third and fourth multilayer conductive layers stacked over the semiconductor substrate to surround one side of the third vertical channel layer and one side of the fourth vertical channel layer, respectively, first charge storage layers formed between the first to fourth vertical channel layers and the first to fourth multilayer conductive layers, a first pipe channel layer formed in the semiconductor substrate to couple lower portions of the first and fourth vertical channel layers, and a second pipe channel layer formed in the semiconductor substrate to couple lower portions of the second and third vertical channel layers.

A semiconductor device according to an embodiment of the present invention may include first, second, fifth and sixth vertical channel layers vertically coupled between a semiconductor substrate and a bit line, third, fourth, seventh and eighth vertical channel layers vertically coupled between the semiconductor substrate and a common source line, first, third, fifth and seventh multilayer conductive layers stacked on the semiconductor substrate at predetermined distances to surround one side of the first, third, fifth and seventh vertical channel layers, respectively, second, fourth, sixth and eighth multilayer conductive layers stacked on the semiconductor substrate at predetermined distances to surround one side of the second, fourth, sixth and eighth vertical channel layers, respectively, and charge storage layers formed between the first to eighth vertical channel layers and the first to eighth multilayer conductive layers, a first pipe channel layer formed in the semiconductor substrate to couple lower portions of the first and eighth vertical channel layers, a second pipe channel layer formed in the semiconductor substrate to couple lower portions of the second and third vertical channel layers, a third pipe channel layer formed in the semiconductor substrate to couple lower portions of the fourth and fifth vertical channel layers, and a fourth pipe channel layer formed in the semiconductor substrate to couple lower portions of the sixth and seventh vertical channel layers.

A semiconductor device according to an embodiment of the present invention may include a common source region formed in a semiconductor substrate, a bit line formed over the semiconductor substrate, first and second vertical channel layers coupled between the bit line and the common source region to face each other at one side of each of the first and second vertical channel layers, first stacked conductive layers stacked over the semiconductor substrate to surround the other side of the first vertical channel layer, and second stacked conductive layers stacked over the semiconductor substrate to surround the other side of the second vertical channel layer.

BRIEF DESCRIPTION OF THE DRAWINGS

FIG. 3 is a cross-sectional view illustrating memory strings according to a first embodiment of the present invention;

DETAILED DESCRIPTION

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
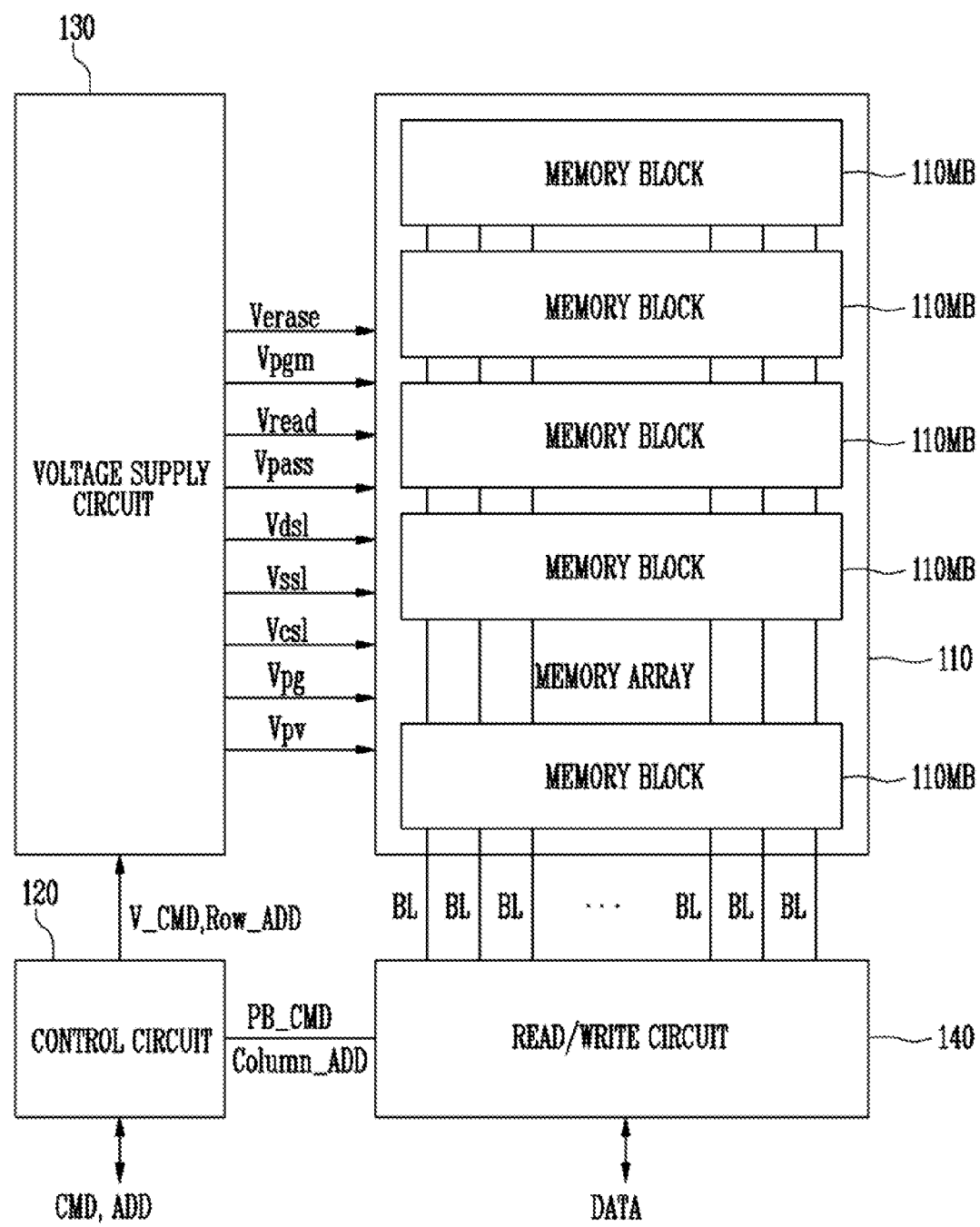
FIG. 1 is a block diagram illustrating a semiconductor device according to an embodiment of the present invention.

FIG. 1 is a block diagram illustrating a semiconductor device according to an embodiment of the present invention.

Referring to FIG. 1, the semiconductor device may include a memory array 110 and an operation circuit 120 to 140. The memory array 110 may include a plurality of memory blocks 110MB. Each of the memory blocks 110MB may include a plurality of memory cells. In a flash memory device, each of the memory blocks 110MB may include flash memory cells. For example, a flash memory cell may have a floating gate formed of polysilicon or a charge storage layer including a nitride layer.

Each of the memory blocks 110MB may include memory strings coupled to bit lines and coupled in parallel with a common source line. Each of the memory strings may have a two-dimensional structure or a three-dimensional structure over a semiconductor substrate. A memory block 110MB including a three-dimensionally structured memory string is described below in detail.

Figure 2A:
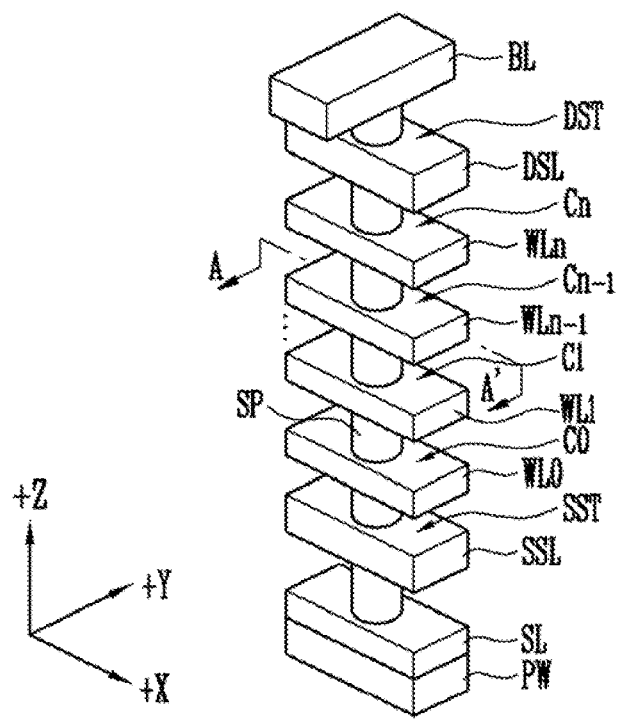
FIGS. 2A and 2B are views illustrating an embodiment of a memory string included in a memory block shown in FIG. 1.
Figure 2B:
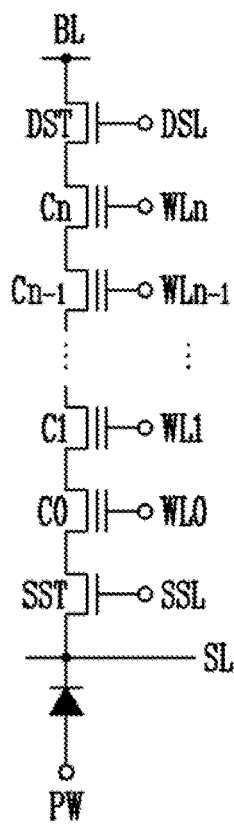

FIGS. 2A and 2B are views illustrating a memory string included in one of the memory blocks 110MB shown in FIG. 1.

Referring to FIGS. 2A and 2B, a common source line SL may be formed over the semiconductor substrate including a P well PW. A vertical channel layer SP may be formed over the common source line SL. A top portion of the vertical channel layer SP may be coupled to the bit line BL. The vertical channel layer SP may include polysilicon. A plurality of conductive layers DSL, WL0 to WLn, and SSL may surround the vertical channel layer SP at different heights/layers. A multilayer (not illustrated) including a charge storage layer may be formed on a surface of the vertical channel layer SP. The multilayer may also be formed between the vertical channel layer SP and the conductive layers DSL, WL0 to WLn, and SSL.

The uppermost conductive layer DSL may be a first selection line (or drain selection line), and the lowermost conductive layer SSL may be a second selection line (or source selection line). The remaining conductive layers WL0 to WLn interposed between the drain and source selection lines DSL and SSL may be a first dummy word line (not illustrated), word lines, and a second dummy word line (not illustrated). Dummy word lines may be omitted.

In other words, the plurality of conductive layers DSL, WL0 to WLn, and SSL that are formed in different layers (or as a multilayer) may be formed over the semiconductor substrate, and the vertical channel layer SP passing through the conductive layers DSL, WL0 to WLn, and SSL may be vertically coupled between the bit line BL and the common source line SL formed on the semiconductor substrate.

A first selection transistor (or drain selection transistor) DST may be formed at a section of the vertical channel layer SP, which is surrounded by the first selection line DSL. Main cell transistors (or main memory cells) Co to Cn may be formed at sections of the vertical channel layer SP, which are surrounded by the word lines WL0 to WLn, respectively. A second selection transistor (or source selection transistor) SST may be formed at a section of the vertical channel layer SP, which is surrounded by the second selection line SSL.

A drain of the first selection transistor DST may be coupled to the bit line BL, and a source of the second selection transistor SST may be coupled to the common source line SL. The memory string having the above-described structure may include the first selection transistor DST, the main cell transistors Cn to C0, and the second selection transistor SST that are coupled in series in the vertical direction to the substrate between the bit line BL and the common source line SL.

Referring again to FIG. 1, the operation circuit 120 to 140 may be configured to perform a program operation, an erase operation, a verify operation and a read operation on memory cells of selected memory strings. The operation circuit may include a control circuit 120, a voltage supply circuit 130 and a read/write circuit 140. The control circuit 120 may control the program operation, the erase operation, the verify operation and the read operation. The voltage supply circuit 130 and the read/write circuit 140 may be configured to perform the program operation, the erase operation, the verify operation and the read operation in response to control of the control circuit 120. In order to perform the program operation, the erase operation, the verify operation and the read operation, the voltage supply circuit 130 may output operating voltages, for example, Verase, Vpgm, Vread, Vpass, Vdsl, Vssl, Vcsl, Vpg, and Vpv, to local lines, for example, DSL, WLn to WL0, SSL, and SL, shown in FIG. 2A, of a selected memory block. The read/write circuit 140 may control precharge/discharge of the bit lines BL or sense a current flow in the bit lines BL. Each of these circuits is described below in detail.

The control circuit 120 may output a voltage control signal V_CMD to control the voltage supply circuit 130 in response to an externally applied command signal so that the voltage supply circuit 130 may generate operating voltages for performing program, erase, verify, and read operations, for example, Verase, Vpgm, Vread, Vpass, Vdsl, Vssl, Vcsl, Vpg, and Vpv, at desired levels. In addition, the control circuit 120 may output a control signal PB_CMD to control circuits, for example, page buffers, included in the read/write circuit 140 in order to perform a program operation, an erase operation, a verify operation and a read operation. In addition, the control circuit 120 may generate a column address signal Column_ADD and a row address signal Row_ADD when an address signal ADD is inputted. At this time, a memory block and a word line to be selected may be determined in response to a row address Row_ADD, and different operating voltages may be applied to the selected word line and unselected word lines.

The control circuit 120 may control the voltage supply circuit 130 and the read/write circuit 140 to perform a program loop including a program operation and a program verify operation by an Increment Step Pulse Programming (ISPP) method. In addition, the control circuit 120 may control the voltage supply circuit 130 and the read/write circuit 140 to perform an erase loop including an erase operation and an erase verify operation by an Increment Step Pulse Programming (ISPP) method.

The voltage supply circuit 130 may generate operating voltages, i.e., an erase voltage Verase, a program voltage Vpgm, a pass voltage Vpass, a read voltage Vread, a pipe gate voltage Vpg, a select gate voltages Vdsl and Vssl, a common source voltage Vcsl, and a verify voltage Vpv, to perform a program operation, an erase operation, a verify operation and a read operation on the memory cells in response to the voltage control signal V_CMD of the control circuit 120. The voltage supply circuit 130 may selectively output these operating voltages to the local lines and the common source line of the selected memory block in response to the row address signal Row_ADD of the control circuit 120.

The voltage supply circuit 130 may include a voltage generator (not illustrated) and a row decoder (not illustrated). The voltage generator may generate the operating voltages in response to the voltage control signal V_CMD of the control circuit 120. The row decoder may transfer the operating voltages to the local lines and the common source line of the selected memory block, among memory blocks, in response to the row address signal Ro_ADD of the control circuit 120. As described above, the voltage supply circuit 130 may output or change the operating voltages in response to voltage control signal V_CMD of the control circuit 120.

The read/write circuit 140 may be coupled to the memory blocks 110MB of the memory array 110 through the bit lines BL. During a program operation, the read/write circuit 140 may selectively precharge the bit lines BL in response to data DATA to be stored in the memory cells and the control signal PB_CMD of the control circuit 120. During a program verify operation or a read operation, the read/write circuit 140 may precharge the bit lines BL, sense voltage variations or current in the bit lines BL, and latch data DATA read out from the memory cells in response to the control signal PB_CMD of the control circuit 120.

Figure 4:
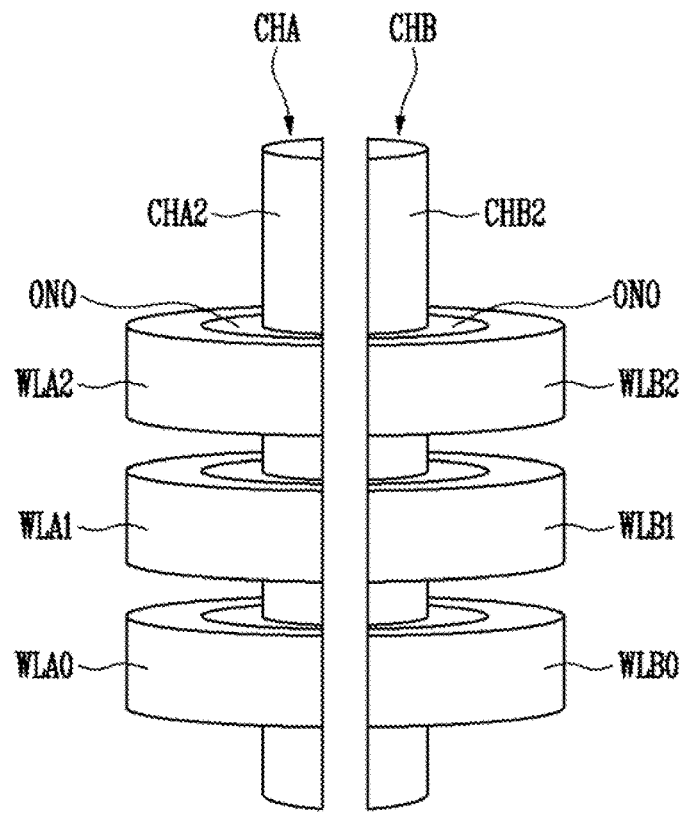
FIG. 4 is a perspective view illustrating the memory strings shown in FIG. 3.
Figure 5:
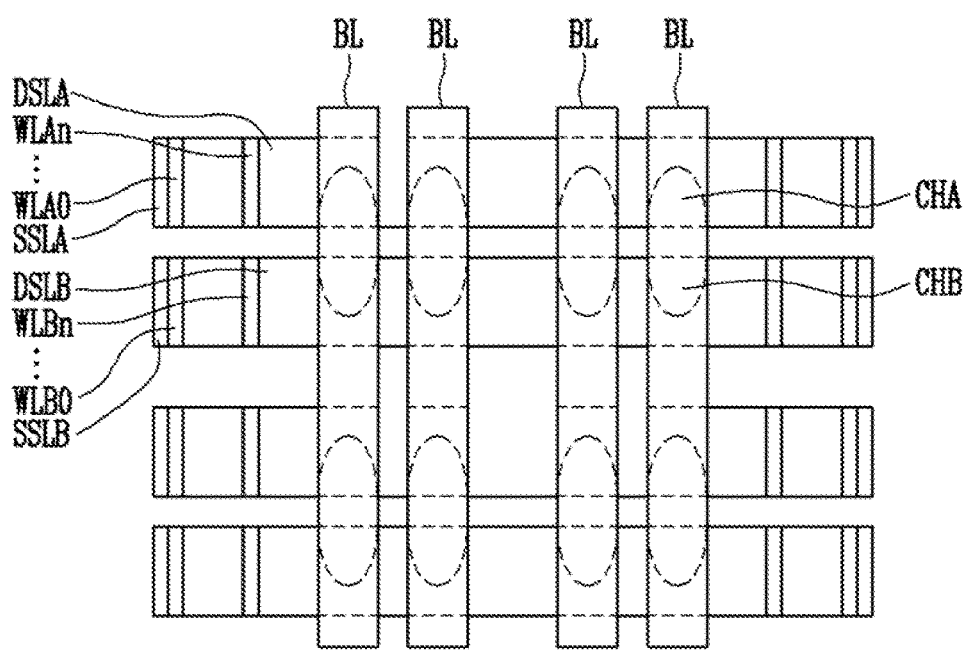
FIG. 5 is a plan view illustrating a memory block according to a first embodiment of the present invention.

In order to increase the number of memory cell formed within a predetermined area, the vertical channel may be separated. FIGS. 3 and 4 are cross-sectional and perspective views illustrating memory strings according to a first embodiment of the present invention. FIG. 5 is a plan view illustrating a memory block according to a first embodiment of the present invention.

Referring to FIGS. 3 to 5, the vertical channel layer SP, shown in FIG. 2, which is coupled in the vertical direction to the substrate (not illustrated) between the bit line BL and the common source line SL, may be divided into two layers. In other words, after the vertical channel layer SP and the conductive layers SSL, WL0 to WLn, and DSL are formed as illustrated in FIG. 2, an etch process may be performed to separate the vertical channel layer SP into two layers before the bit line BL is formed. A space from which a part of the vertical channel layer SP is removed through the etch process may be filled with an insulating layer OX. When the vertical channel layer SP is etched to separate the vertical channel layer SP into two layers, the conductive layers SSL, WL0 to WLn, and DSL may also be etched and separated into first conductive layers SSLA, WLA0 to WLAn, and DSLA and second conductive layers SSLB, WLB0 to WLBn, and DSLB.

As a result, two vertical channel layers CHA and CHB may be coupled in the vertical direction to the substrate between the bit line BL and the common source line SL. The first vertical channel layer CHA may include a first select vertical channel layer CHA1, a cell vertical channel layer CHA2 and a second select vertical channel layer CHA3. The second select vertical channel layer CHA3 may be coupled to the bit line BL through a contact plug CT. The second vertical channel layer CHB may include a first select vertical channel layer CHB1, a cell vertical channel layer CHB2 and a second select vertical channel layer CHB3. The second select vertical channel layer CHB3 may be coupled to the bit line BL through the contact plug CT.

An etched surface of the first vertical channel layer CHA and an etched surface of the second vertical channel layer CHB may face each other. When the vertical channel layer has a cylindrical shape, one surface of the first vertical channel layer CHA may be round and the other surface thereof corresponding to the etched surface may be flat. In addition, one surface of the second vertical channel layer CHB may be round, and the other surface thereof corresponding to the etched surface facing the first vertical channel layer CHA may be flat.

The first conductive layers SSLA, WLA0 to WLAn, and DSLA may surround the round surface of the first vertical channel layer CHA. The second conductive layers SSLB, WLB0 to WLBn, and DSLB may surround the round surface of the second vertical channel layer CHB.

A charge storage layer may be formed between a vertical channel layer and conductive layers. For example, a multilayer ONO including a tunnel insulating layer Tox, a charge storage layer CTL and a blocking insulating layer Box may be formed between the first vertical channel layer CHA and the first conductive layers WLA0 to WLAn and between the second vertical channel layer CHB and the second conductive layers WLB0 to WLBn. In addition, a gate insulating layer Gox instead of the multilayer ONO may be formed between the first vertical channel layer CHA and the first conductive layers SSLA and DSLA and between the second vertical channel layer CHB and the second conductive layers SSLB and DSLB.

As described above, after the conductive layers the multilayer and the vertical channel layer are formed, these layers may be separated by performing the etch process, so that the number of memory cells may be doubled. Therefore, more memory cells may be formed within a predetermined area.

Another embodiment of a memory string having a three-dimensional structure is described below.

Figure 6A:
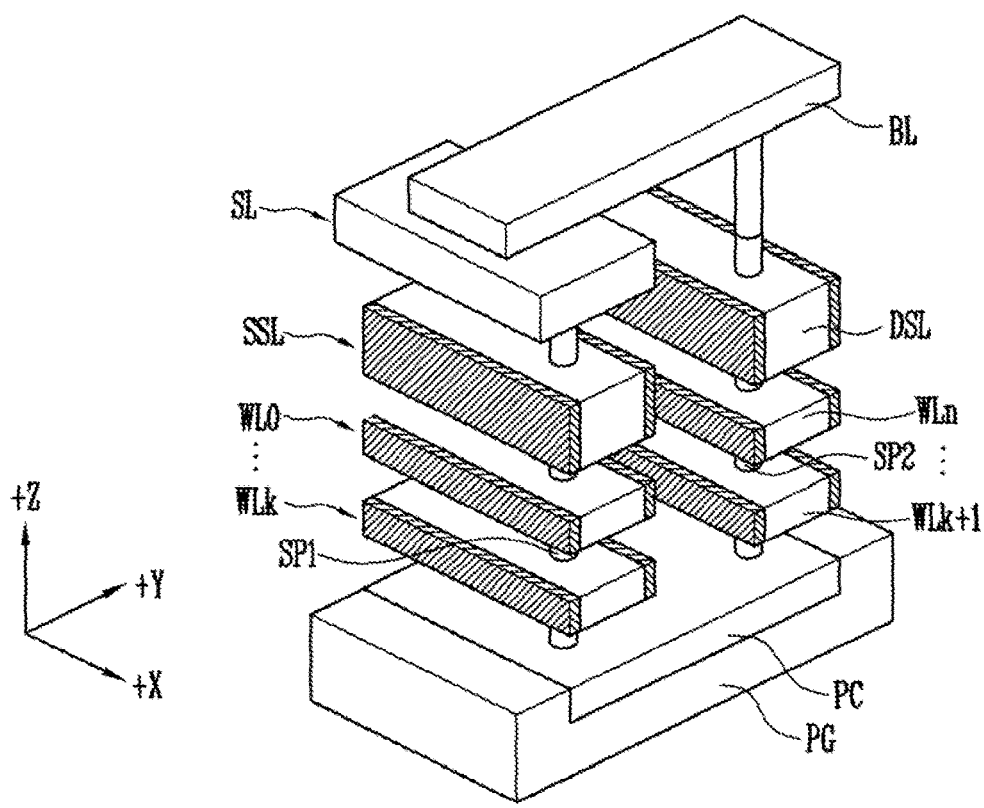
FIGS. 6A and 6B are views illustrating another embodiment of the memory string included in the memory block shown in FIG. 1.
Figure 6B:
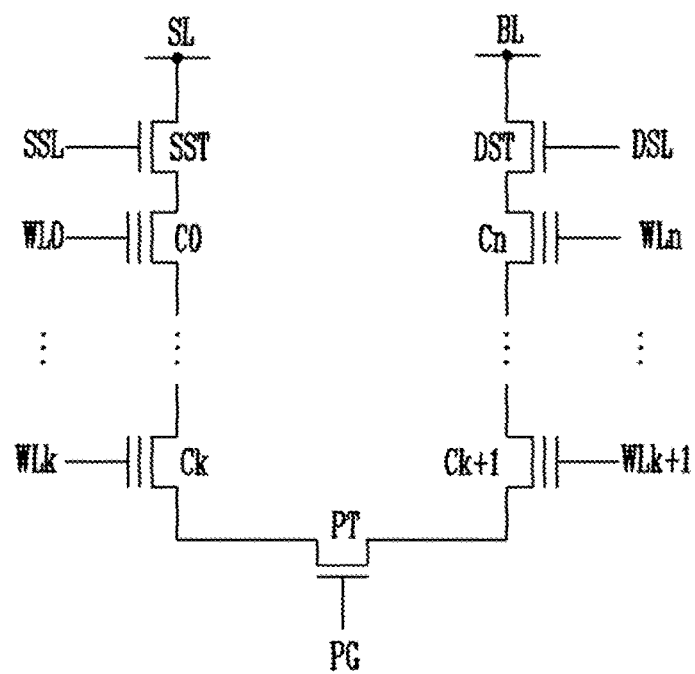

FIGS. 6A and 6B are views illustrating another embodiment of the memory string included in the memory block shown in FIG. 1.

Referring to FIGS. 6A and 6B, a pipe gate PG including a recessed portion may be formed over a semiconductor substrate (not illustrated), and a pipe channel layer PC may be formed in the recessed portion of the pipe gate PG. A pipe transistor PT may include the pipe gate PG and the pipe channel layer PC. A pair of vertical channel layers SP1 and SP2 may be formed over the pipe channel layer PC. A top portion of the first vertical channel layer SP1 may be coupled to the common source line SL, and a top portion of the second vertical channel layer SP2 may be coupled to the bit line BL. The vertical channel layers SP1 and SP2 may include polysilicon.

A plurality of conductive layers SSL and WL0 to WLk may surround the first vertical channel layer SP1 at different heights/layers. In addition, a plurality of conductive layers DSL and WLn to WLk+1 may surround the second vertical channel layer SP2 at different heights/layers. A multilayer (not illustrated) including a charge storage layer may be formed on surfaces of the vertical channel layers SP1 and SP2 and a surface of the pipe channel layer PC. The multilayer may also be located between the vertical channel layers SP1 and SP2 and the conductive layers SSL, WL0 to WLn, and DSL and between the pipe channel layer PC and the pipe gate PC.

The uppermost conductive layer SSL surrounding the first vertical channel layer SP1 may be a source selection line, and the conductive layers WL0 to WLk under the source selection line SSL may be word lines. The uppermost conductive layer DSL surrounding the second vertical channel layer SP2 may be a drain selection line, and the conductive layers WLk+1 to WLn under the drain selection line DSL may be word lines. Some of the word lines WL0 to WLk may be dummy word lines, and some of the word lines WLk+1 to WLn may be dummy word lines.

In other words, pairs of the conductive layers SSL, WL0 to WLn, and DSL may be stacked over the semiconductor substrate. The first vertical channel layer SP1 passing through the conductive layers SSL and WL0 to WLk may be coupled in the vertical direction between the common source line SL and the pipe channel layer PC. The second vertical channel layer SP2 passing through the conductive layers DSL and WLn to WLk+1 may be coupled in the vertical direction between the bit line BL and the pipe channel layer PC.

A drain selection transistor DST may be formed at a section of the second vertical channel layer SP2, which is surrounded by the drain selection line DSL. Main cell transistors Cn to Ck+1 may be formed at sections of the second vertical channel layer SP2, which are surrounded by the word lines WLn to WLk+1. A source selection transistor SST may be formed at a section of the first vertical channel layer SP1, which is surrounded by the source selection line SSL. Main cell transistors C0 to Ck may be formed at sections of the first vertical channel layer SP1, which are surrounded by the word lines WL0 to WLk.

The memory string having the above-described structure may include the drain selection transistor DST and the main cell transistors Cn to Ck+1 coupled in series in the vertical direction to the substrate between the bit line BL and the pipe channel layer PC, and the source selection transistor SST and the main cell transistors C0 to Ck coupled in series in the vertical direction to the substrate between the common source line SL and the pipe channel layer PC.

Figure 7:
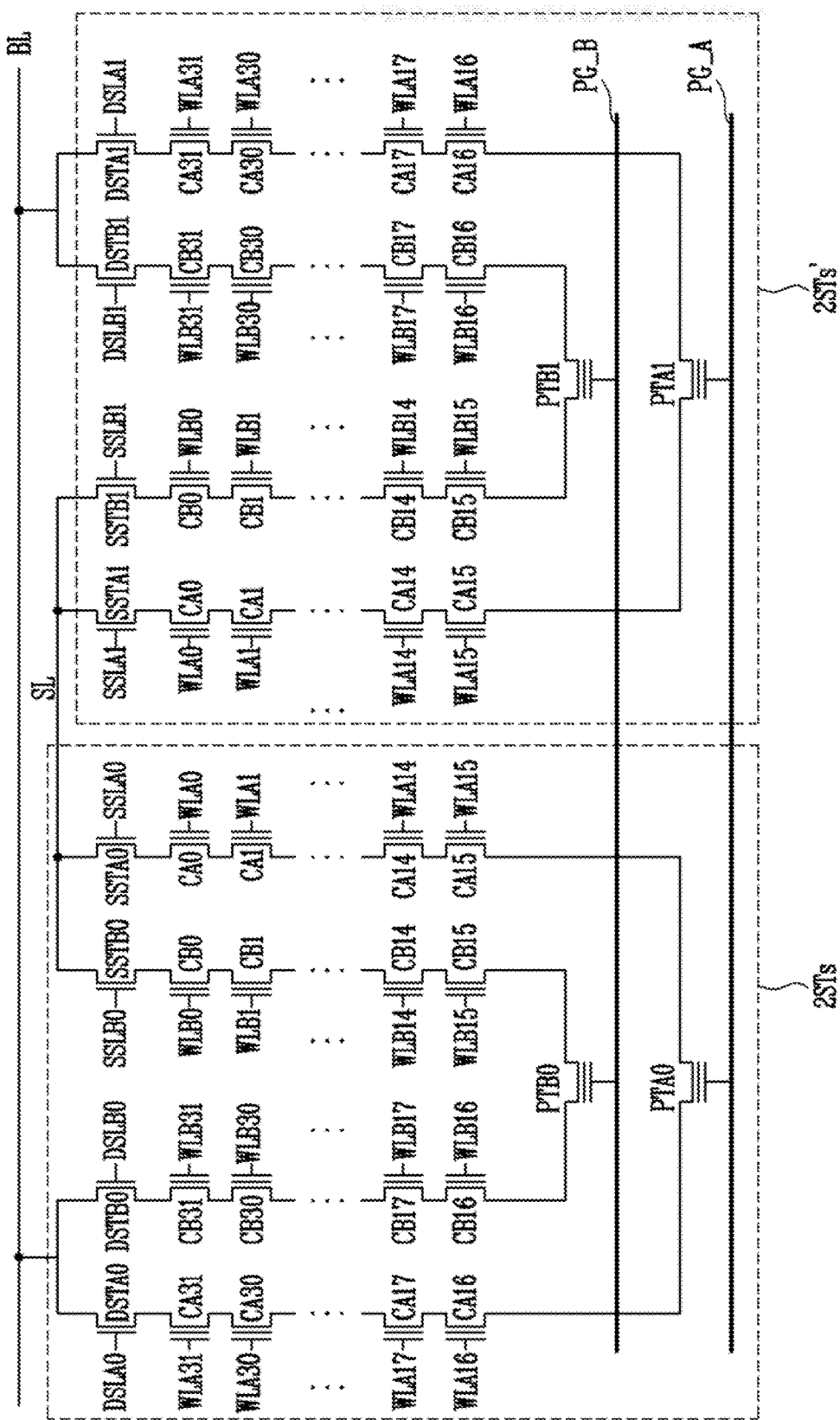
FIG. 7 is a circuit diagram illustrating memory strings according to a second embodiment of the present invention.

These vertical channel layers may be separated in order to increase the number of memory cells formed within a predetermined area. FIG. 7 is a circuit diagram illustrating memory strings according to a second embodiment of the present invention.

Referring to FIG. 7, a vertical channel layer included in a memory string may be separated into two vertical channel layers. That is, the memory string, shown in FIG. 6B, may be separated into two memory strings 2STs. Although the two memory strings 2STs may be coupled between the same bit line BL and the common source line SL, drain selection lines DSLA0 and DSLB0, word lines WLA0 to WLA31 and WLB0 to WLB31, and source selection lines SSLA0 and SSLB0 of the memory strings 2STs may be separated from each other. Since the pipe transistor is also separated into two different pipe transistors, the two memory strings 2STs may include pipe transistors PTA0 and PTB0, respectively. A detailed description thereof is given below.

First and second pipe transistors PTA0 and PTB0 may be formed in the semiconductor substrate (not illustrated). A first drain selection transistor DSTA0 may be coupled to the bit line BL. Memory cells CA16 to CA31 may be coupled between the first drain selection transistor DSTA0 and the first pipe transistor PTA0. A first source selection transistor SSTA0 may be coupled to the common source line SL. Memory cells CA0 to CA15 may be coupled between the first source selection transistor SSTA0 and the first pipe transistor PTA0. A second drain selection transistor DSTB0 may be coupled to the bit line BL. Memory cells CB16 to CB31 may be coupled between the second drain selection transistor DSTB0 and the second pipe transistor PTB0. A second source selection transistor SSTB0 may be coupled to the common source line SL. Memory cells CB0 to CB15 may be coupled between the second source selection transistor SSTB0 and the second pipe transistor PTB0. As described above, one memory string may be separated to the two memory strings 2STS.

In the same manner, in another pair of memory strings 2STs', a first drain selection transistor DSTA1 may be coupled to the bit line BL, and memory cells CA16 to CA31 may be coupled between the first drain selection transistor DSTA1 and a first pipe transistor PTA1. A first source selection transistor SSTA1 may be coupled to the common source line SL. Memory cells CA0 to CA15 may be coupled between the first source selection transistor SSTA1 and the first pipe transistor PTA1. A second drain selection transistor DSTB1 may be coupled to the bit line BL. Memory cells CB16 to CB31 may be coupled between the second drain selection transistor DSTB1 and a second pipe transistor PTB1. A second source selection transistor SSTB1 may be coupled to the common source line SL. Memory cells CB0 to CB15 may be coupled between the second source selection transistor SSTB1 and the second pipe transistor PTB1.

Figure 8:
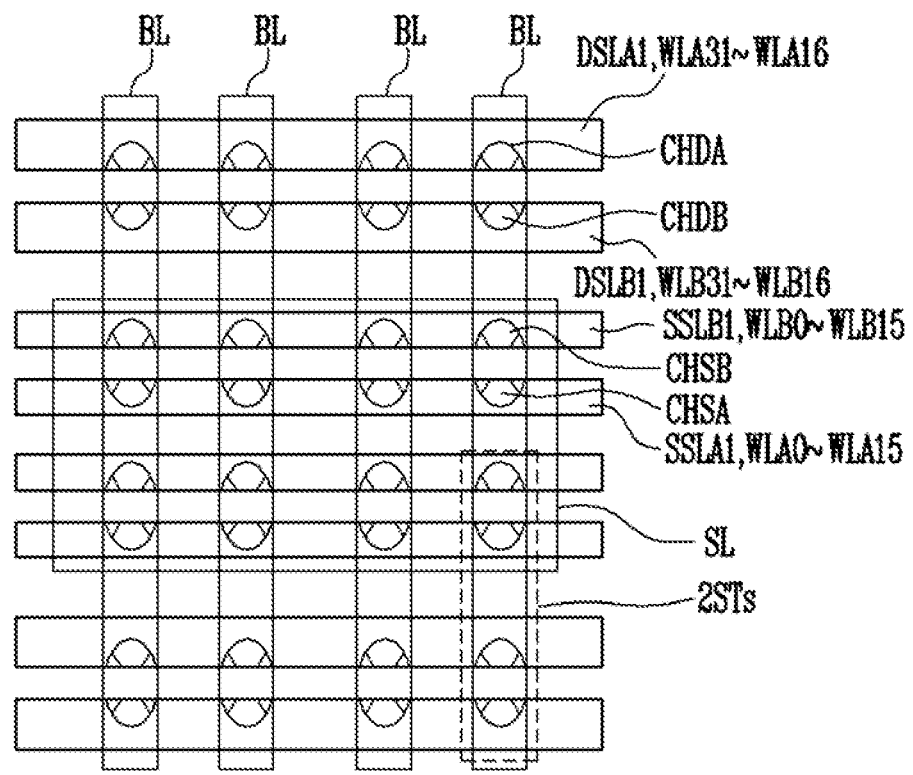
FIG. 8 is a plan view illustrating a memory block according to a second embodiment of the present invention.
Figure 9:
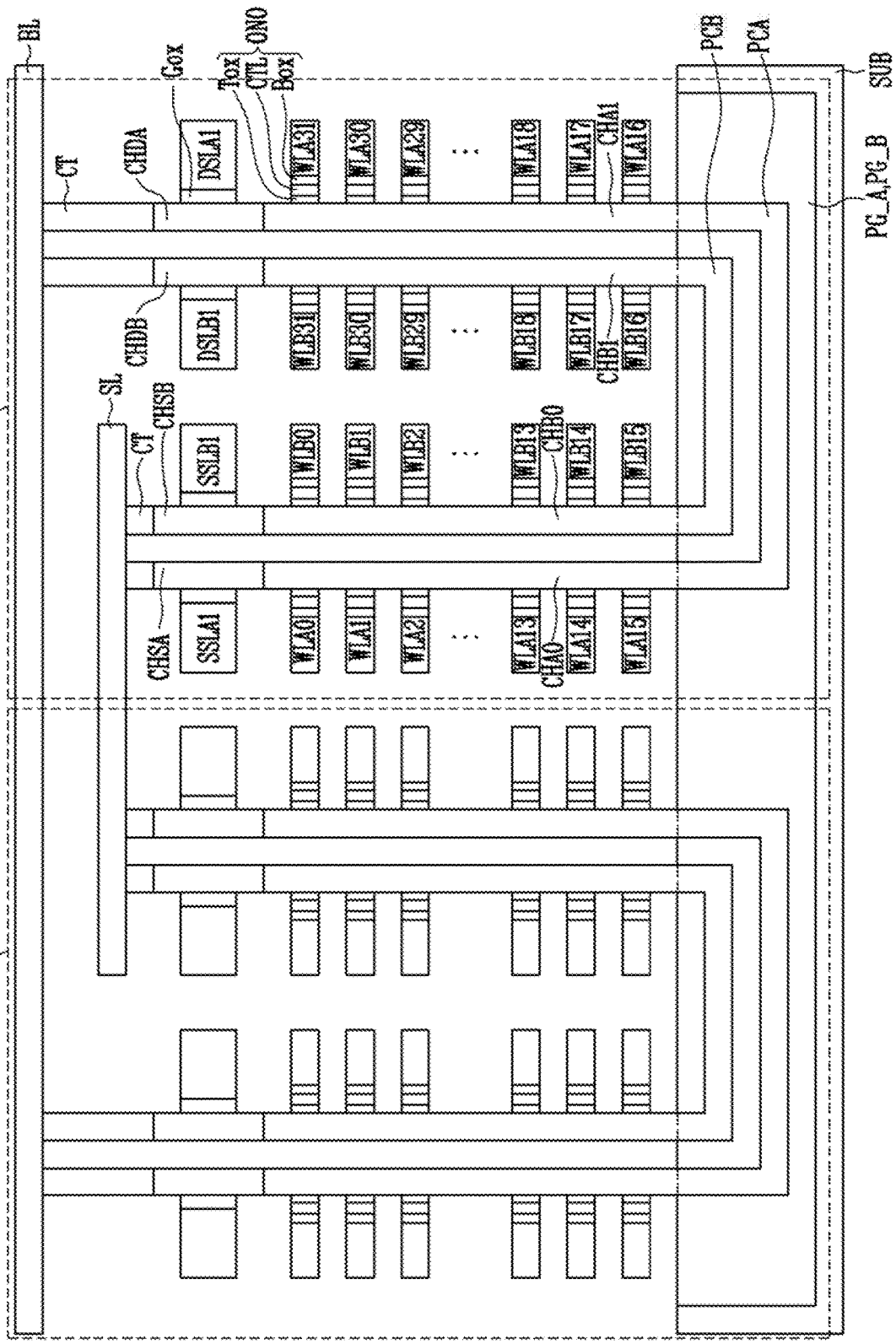
FIG. 9 is a cross-sectional view illustrating the memory strings shown in FIG. 7.

The above-described structure of the memory strings is described below in more detail. FIG. 8 is a plan view illustrating a memory block according to a second embodiment of the present invention. FIG. 9 is a cross-sectional view illustrating the memory strings shown in FIG. 7.

Referring to FIGS. 8 and 9, pipe gates PG_A and PG_B of pipe transistors may be formed in a semiconductor substrate SUB. Though not illustrated in FIGS. 8 and 9, the first pipe gate PG_A and the second pipe gate PG_B nay be formed in different areas and separated from each other. A first pipe, channel layer PCA may be formed in a trench of the first pipe gate PB_A. A second pipe channel layer PCB may be formed in a trench of the second pipe gate PB_B. A pipe gate insulating layer (not illustrated) may be further formed between the first pipe gate PG_A and the first pipe channel layer PCA and between the second pipe gate PG_B and the second pipe channel layer PCB. The pipe gate insulating layer (not illustrated) may have an Oxide Nitride Oxide (ONO) structure and include an oxide layer.

The vertical channel layer SP2, shown in FIG. 6A, which is coupled in the vertical direction to the semiconductor substrate SUB between the bit line BL and one end of the first pipe channel layer PCA (or the second pipe channel layer PCB), and the vertical channel layer SP1, shown in FIG. 6A, which is coupled in the vertical direction to the semiconductor substrate SUB between the common source line SL and the other end of the first pipe channel layer PCA (or the second pipe channel layer PCB) may be divided into halves. In other words, after the vertical channel layers and the conductive layers are stacked over the substrate SUB, an etch process may be performed to separate each of the vertical channel layers into two layers before the bit line BL is formed. A space from which parts of the vertical channel layers are removed through the etch process may be filled with an insulating layer (not illustrated).

Each of the vertical channel layers may be separated into two layers. Specifically, the vertical channel layer coupled to the bit line BL may be divided into a first drain vertical channel layer CHDA and CHA1 and a second drain vertical channel layer CHDB and CHB1. The first drain vertical channel layer CHDA and CHA1 may include a vertical channel layer CHA1 for memory cells and a vertical channel layer CHDA for a drain selection transistor. The second drain vertical channel layer CHDB and CHB1 may include a vertical channel layer CHB1 for memory cells and a vertical channel layer CHDB for a drain selection transistor. The vertical channel layers CHDA and CHDB for a drain selection transistor may be coupled to the bit line BL through contact plugs CT.

In addition, the vertical channel layer coupled to the common source line SL may be divided into a first source vertical channel layer CHSA and CHA0 and a second source vertical channel layer CHSB and CHB0. The first source vertical channel layer CHSA and CHA0 may include a vertical channel layer CHA0 for memory cells and a vertical channel layer CHSA for a source selection transistor. The second source vertical channel layer CHSB and CHB0 may include a vertical channel layer CHB0 for memory cells and a vertical channel layer CHSB for a source selection transistor. The vertical channel layers CHSA and CHSB for a source selection transistor may be coupled to the common source line SL through contact plugs CT.

When the vertical channel layers are etched to separate each of the vertical channel layers into two layers, the stacked conductive layers may also be etched and separated into first stacked conductive layers DSLA1 and WLA31 to WLA16, second stacked conductive layers DSLB1 and WLB31 to WLB16, third stacked conductive layers SSLB1 and WLB0 to WLB15, and fourth stacked conductive layers SSLA1 and WLA0 to WLA15.

Another pair of memory strings 2STs including separated vertical channel layers and multilayer conductive layers may be formed between the bit line BL and the common source line SL. Accordingly, two memory strings coupled between the bit line BL and the common source line SL may include two pairs of memory strings 2STs and 2STs'.

As described above, the selection lines DSLA1 DSLB1, SSLA1, and SSLB1 in the pair of the memory strings 2STs' may be separated from each other. In addition, the selection lines DSLA1, DSLB1, SSLA1, and SSLB1 included in the pair of the memory strings 2STs' may be separated from the selection lines of the different pair of the memory strings 2STs.

However, end portions of the word lines WLA0 to WLA31 and WLB0 to WLB31, included in the pair of the memory string 2STs', may be coupled to end portions of the word lines of the different pair of the memory strings 2STs. For example, the end portions of the word lines WLA31 to WLA16 and WLB31 to WLB16, among the first stacked conductive layers DSLA1 and WLA31 to WLA16 and the second stacked conductive layers DSLB1 and WLB31 to WLB16 of the memory strings 2STs', may be coupled to the end portions of the word lines WLA31 to WLA16 and WLB31 to WLB16, among the seventh stacked conductive layers DSLA0 and WLA31 to WLA16, and the eighth stacked conductive layers DSLB0 and WLB31 to WLB16, shown in FIG. 7, of the memory strings 2STs. In addition, the end portions of the word lines WLA15 to WLA0 and WLB15 to WLB0, among the third conductive layer SSLA1 and WLA15 to WLA0 and the fourth tacked conductive layers SSLB1 and WLB15 to WLB0 of the memory strings 2STs', may be coupled to the end portions of the word lines WLA15 to WLA0 and WLB15 to WLB0, among the fifth stacked conductive layers SSLA0 and WLA15 to WLA0, and the sixth stacked conductive layers SSLB0 and WLB15 to WLB0, shown in FIG. 7, of the memory strings 2STs.

An etched surface of the first drain vertical channel layer CHDA and CHA1 may face an etched surface of the second drain vertical channel layer CHDB and CHB1. When the vertical channel layer has a cylindrical shape, one surface of the first drain vertical channel layer CHDA and CHA1 may be round, and the other surface thereof corresponding to the etched surface may be flat. In addition, one surface of the second drain vertical channel layer CHDB and CHB1 may be round, and the other surface thereof corresponding to the etched surface facing the first drain vertical channel layer CHDA and CHA1 may be flat.

The first stacked conductive layers DSLA1 and WLA31 to WLA16 may surround the round surface of the first drain vertical channel layer CHDA and CHA1. The second stacked conductive layers DSLB1 and WLB31 to WLB16 may surround the round surface of the second drain vertical channel layer CHDB and CHB1. The fourth stacked conductive layers SSLA1 and WLA0 to WLA15 may surround the round surface of the first source vertical channel layer CHSA and CHA0. The third stacked conductive layers SSLB1 and WLB0 to WLB15 may surround a round surface of the second source vertical channel layer CHSB and CHB0.

In other words, the vertical channel layers CHDA and CHA1, CHDB and CHB1, CHSB and CHB0, and CHSA and CHA0 may have a round surface at one side which is surrounded by the conductive layers DSLA1 and WLA31 to WLA16, DSLB1 and WLB31 to WLB16, SSLB1 and WLB0 to WLB15, and SSLA1 and WLA0 to WLA15, respectively, while having a flat surface on the other side. The side surfaces of the vertical channel layers CHDA and CHA1, CHDB and CHB1, CHSB and CHB0, and CHSA and CHA0 not surrounded by the conductive layers DSLA1 and WLA31 to WLA16, DSLB1 and WLB31 to WLB16, SSLB1 and WLB0 to WLB15, and SSLA1 and WLA0 to WLA15, respectively, may face each other.

In other words, the side surface of the first drain vertical channel layer CHDA and CHA1 not surrounded by the first stacked conductive layers DSLA1 and WLA31 to WLA16 may face the side surface of the second drain vertical channel layer CHDB and CHB1 not surrounded by the second stacked conductive layers DSLB1 and WLB31 to WLB16. The side surface of the second source vertical channel layer CHSB and CHB0 not surrounded by the third stacked conductive layers SSLB1 and WLB0 to WLB15 may face the side surface of the first source vertical channel layer CHSA and CHA0 not surrounded by the fourth stacked conductive layers SSLA1 and WLA0 to WLA15.

The charge storage layer CTL may be formed between the vertical channel layers CHDA and CHA1, CHDB and CHB1, CHSB and CHB0, and CHSA and CHA0 and the conductive layers DSLA1 and WLA31 to WLA16, DSLB1 and WLB31 to WLB16, SSLB1 and WLB0 to WLB15, and SSLA1 and WLA0 to WLA15. For example, the multilayer ONO including the tunnel insulating layer Tox, the charge storage layer CTL and the blocking insulating layer Box may be formed between the vertical channel layers CHA1, CHB1, CHB0 and CHA0 and the conductive layers WLA31 to WLA16, WLB31 to WLB16, WLB0 to WLB15, and WLA0 to WLA15. In addition, the gate insulating layer Gox instead of the multilayer ONO may be formed between the vertical channel layers CHDA, CHDB, CHSA, and CHSB and the conductive layers SSLA1, SSLB1, DSLA1 and DSLB1.

The first pipe channel layer PCA may be formed in the semiconductor substrate SUB in order to couple lower portions of the first drain vertical channel layer CHDA and CHA1 and the first source vertical channel layer CHSA and CHA0. The second pipe channel layer PCB may be formed in the semiconductor substrate SUB in order to couple lower portions of the second drain vertical channel layer CHDB and CHB1 and the second source vertical channel layer CHSB and CHB0. The first pipe channel layer PCA may be located under the second pipe channel layer PCB.

As described above, after the conductive layers, the multilayer and vertical channel layers are formed, these layers may be separated by an etch process before the bit line is formed, so that the number of memory cells may be doubled. Therefore, more memory cells may be formed within a predetermined area.

Figure 10:
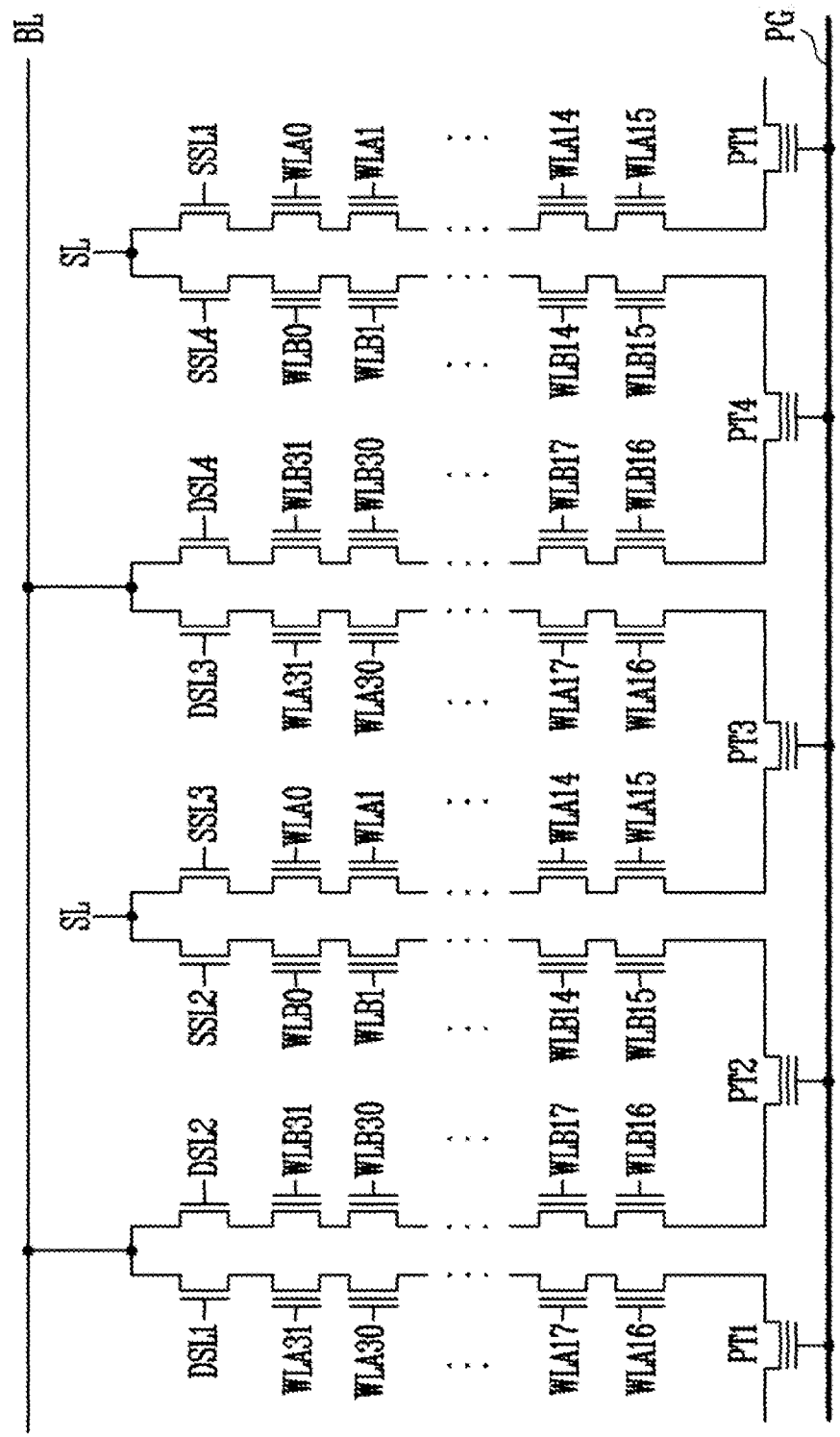
FIG. 10 is a circuit diagram illustrating memory strings according to a third embodiment of the present invention.

The memory string may be separated by using another method in order to increase the number of memory cells formed within a predetermined area. FIG. 10 is a circuit diagram illustrating memory strings according to a third embodiment of the present invention.

Referring to FIG. 10, lines DS1 to DSLA, SSL1 to SSL4, WLA0 to WLA31, and WLB0 to WLB31 composed of conductive layers stacked over a substrate may be the same as the lines of the memory strings shown in FIG. 7. However, the connection relationship between pipe transistors PT1 to PT4 formed over the substrate may be different from that of the pipe transistors shown in FIG. 7. For example, gates of the pipe transistors PT1 to PT4 may be connected in a single body to form the single pipe gate PG and may be controlled at the same time. A detailed description thereof is given below.

Figure 11:
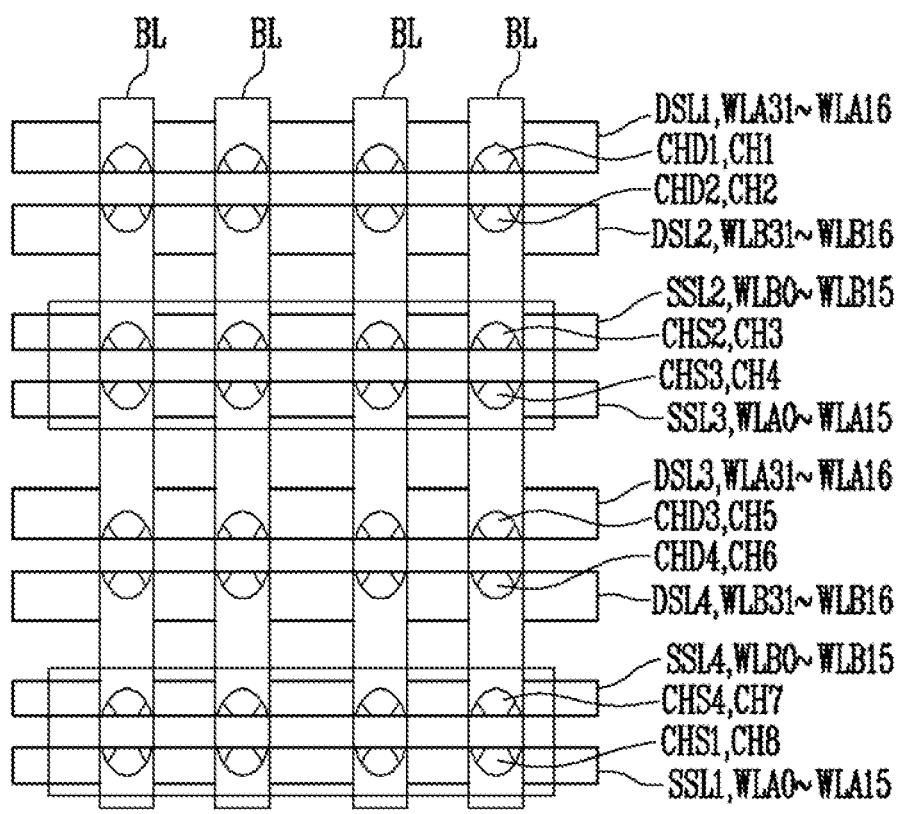
FIG. 11 is a plan view illustrating a memory block according to a third embodiment of the present invention.
Figure 12:
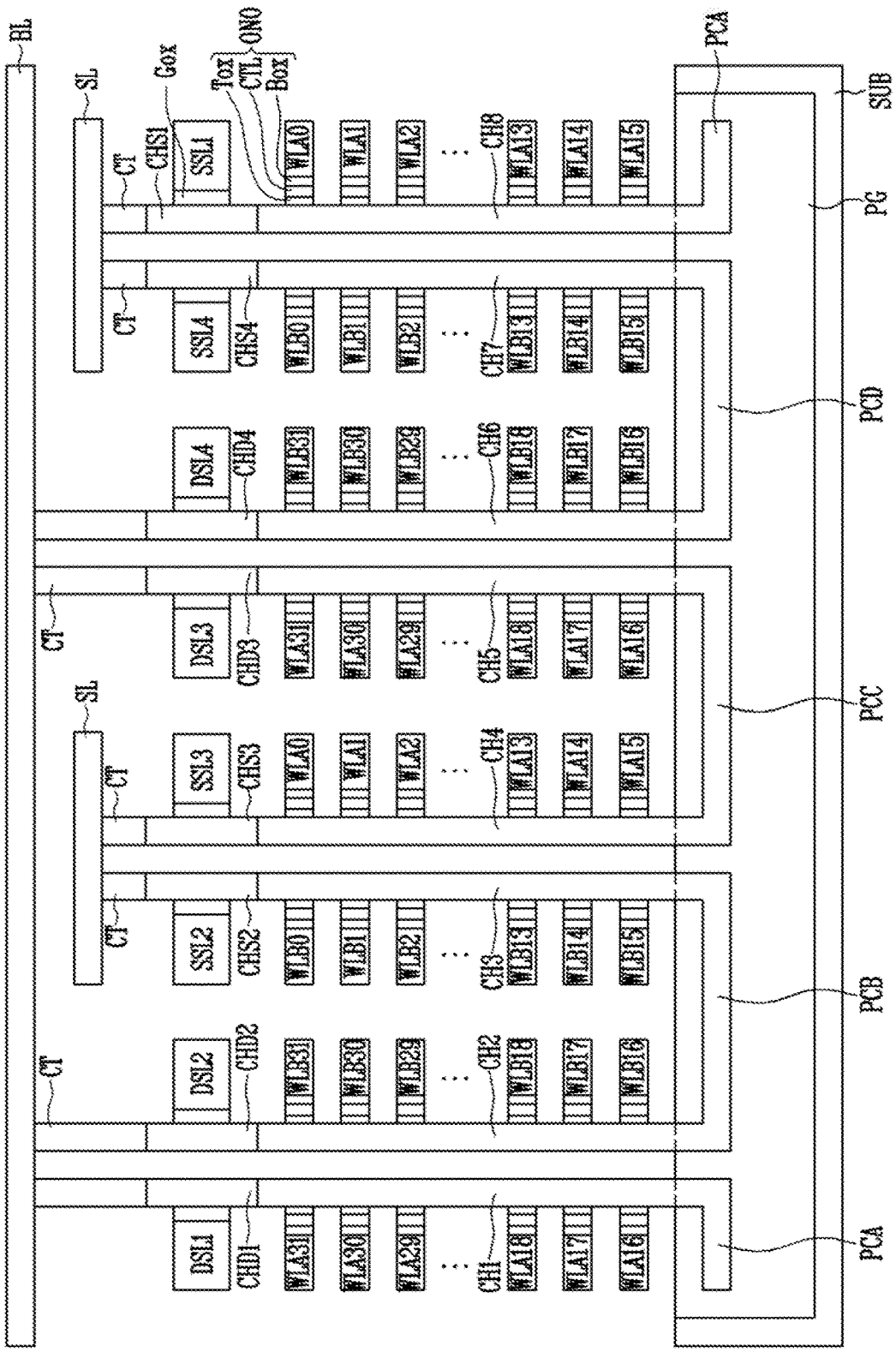
FIG. 12 is a cross-sectional view illustrating the memory strings shown in FIG. 10.

FIG. 11 is a plan view illustrating a memory block according to a third embodiment of the present invention. FIG. 12 is a cross-sectional view illustrating the memory strings shown in FIG. 10.

Referring to FIGS. 11 and 12, the pipe gate PG for the pipe transistors may be formed in the semiconductor substrate SUB, and pipe channel layers PCA to PCD may be formed in trenches of the pipe gate PG. A pipe gate insulating layer (not illustrated) may be further formed between the pipe gate PG and the pipe channel layers PCA to PCD. The pipe gate insulating layer (not illustrated) may have an Oxide Nitride Oxide (ONO) structure and include an oxide layer.

First, second, fifth and sixth vertical channel layers CHD1/CH1, CHD2/CH2, CHD3/CH5, and CHD4/CH6 may be coupled in the vertical direction between the semiconductor substrate SUB and the bit line BL. More specifically, lower portions of the first, second, fifth and sixth vertical channel layers CHD1/CH1, CHD2/CH2, CHD3/CH5, and CHD4/CH6 may be coupled to the pipe channel layers PCA, PCB, PCC and PCD, respectively, and upper portions thereof may be coupled in common to the bit line BL. Third, fourth, seventh and eighth vertical channel layers CHS2/CH3, CHS3/CH4, CHS4/CH7 and CHS1/CH8 may be coupled in the vertical direction between the semiconductor substrate SUB and the common source line SL. More specifically, lower portions of the third fourth, seventh and eighth vertical channel layers CHS2/CH3, CHS3/CH4, CHS4/CH7, and CHS1/CH8 may be coupled to the pipe channel layers PCA, PCB PCC, and PCD, respectively, and upper portions thereof may be coupled in common to the common source line SL.

The first vertical channel layer CHD1/CH1 and the second vertical channel layer CHD2/CH2 may be formed by separating one vertical channel layer. The third vertical channel layer CHS2/CH3 and the fourth vertical channel layer CHS3/CH4 may be formed by separating one vertical channel layer. The fifth vertical channel layer CHD3/CH5 and the sixth vertical channel layer CHD4/CH6 may be formed by separating one vertical channel layer. The seventh vertical channel layer CHS4/CH7 and the eighth vertical channel layer CHS1/CH8 may be formed by separating one vertical channel layer.

The vertical channel layers each may include a vertical channel layer for a selection transistor and vertical channel layers for memory cells. The vertical channel layers CHD1 to CHD4 and CHS1 to CHS4 for selection transistors may be coupled to the bit line BL or the common source line SL through contact plugs CT.

The first, third, fifth and seventh multilayer conductive layers DSL1 and WLA31 to WLA16, SSL2 and WLB15 to WLB0, DLS3 and WLA31 to WLA16, and SSL4 and WLB15 to WLB0 may be stacked at predetermined distances to surround side surfaces the first, third, fifth, and seventh vertical channel layers CHD1/CH1, CHS2/CH3, CHD3/CH5, and CHS4/CH7, respectively. The second, fourth, sixth and eighth multilayer conductive layers DSL2 and WLB31 to WLB16, SSL3 and WLA15 to WLA0, DSL4 and WLB31 to WLB16, and SSL1 and WLA15 to WLA0 may be stacked at predetermined distances to surround side surfaces of the second, fourth, sixth and eighth vertical channel layers CHD2/CH2, CHS3/CH4, CHD4/CH6, and CHS1/CH8, respectively.

When an etch process is formed to separate the vertical channel layers before the bit line BL or the common source line SL is formed, the multilayer conductive layers may also be etched and separated. For example, the first stacked conductive layers DSL1 and WLA31 to WLA16 and the second stacked conductive layers DSL2 and WLB31 to WLB16 may be formed by separating a set of stacked conductive layers. The third stacked conductive layers SSL2 and WLB15 to WLB0 and the fourth stacked conductive layers SSL3 and WLA15 to WLA0 may be formed by separating a set of stacked conductive layers. The fifth stacked conductive layers DSL3 and WLA31 to WLA16 and the sixth stacked conductive layers DSL4 and WLB31 to WLB16 may be formed by separating a set of stacked conductive layers. The seventh stacked conductive layers SSL4 and WLB15 to WLB0 and the eighth stacked conductive layers SSL1 and WLA15 to WLA0 may be formed by separating a set of stacked conductive layers.

The uppermost conductive layers DSL1, DSL2, DSL3 and DLS4 of the first, second, fifth and sixth multilayer conductive layers DSL1 and WLA31 to WLA16, DSL2 and WLB31 to WLB16, DSL3 and WLA31 to WLA16, and DLS4 and WLB31 to WLB16 may function as drain selection lines. The uppermost conductive layers SSL2, SSL3, SSL4 and SSL1 of the third, fourth, seventh and eighth conductive layers SSL2 and WLB15 to WLB0, SSL3 and WLA15 to WLA0, SLS4 and WLB15 to WLB0, and SSL1 and WLA15 to WLA0 may function as source selection lines. The remaining conductive layers WLA0 to WLA31, and WLB0 to WLB31 may function as word lines.

End portions of conductive layers functioning as word lines of multilayer conductive layers may be coupled to each other. For example, the conductive layers WLA31 to WLA16 of the first stacked conductive layers DSL1 and WLA31 to WLA16 and the fifth stacked conductive layers DSL3 and WLA31 to WLA16 may be electrically or physically connected to each other. The conductive layers WLB31 to WLB16 of the second stacked conductive layers DSL2 and WLB31 to WLB16 and the sixth stacked conductive layers DSL4 and WLB31 to WLB16 may be electrically or physically connected to each other. The conductive layers WLB15 to WLB0 of the third stacked conductive layers SSL2 and WLB15 to WLB0 and the seventh stacked conductive layers SSL4 and WLB15 to WLB0 may be electrically or physically connected to each other. The conductive layers WLA15 to WLA0 of the fourth stacked conductive layers SSL3 and WLA15 to WLA0 and the eighth stacked conductive layers SSL1 and WLA15 to WLA0 may be electrically or physically connected to each other.

The charge storage layers CTL may be arranged between the vertical channel layers CHD1 to CHD4, CHS1 to CHS4, and CH1 to CH8 and the conductive layers DSL1 to DSL4, SSL1 to SSL4, WLA0 to WLA31, and WLB0 to WLB31. For example, the multilayer ONO including the tunnel insulating layer Tox, the charge storage layer CTL and the blocking insulating layer Box may be formed between the vertical channel layers CH1 to CH8 and the conductive layers WLA0 to WLA31 and WLB0 to WLB31. In addition, the gate insulating layer Gox instead of the multilayer ONO may be formed between the vertical channel layers CHD1 to CHD4 and CHS1 to CHS4 and the conductive layers DSL1 to DSL4 and SSL1 to SSL4.

The first pipe channel layer PCA may be formed to couple the lower portions of the first vertical channel layer CHD1/CH1 and the eighth vertical channel layer CHS1/CH8. The second pipe channel layer PCB may be formed to couple the lower portions of the second vertical channel layer CHD2/CH2 and the third vertical channel layer CHS2/CH3. The third pipe channel layer PCC may be formed to couple the lower portions of the fourth vertical channel layer CHS3/CH4 and the fifth vertical channel layer CHD3/CH5. The fourth pipe channel layer PCD may be formed to couple the lower portions of the sixth vertical channel layer CHD4/CH6 and the seventh vertical channel layer CHS4/CH7.

When the vertical channel layers CHD1 to CHD4, CHS1 to CHS4, and CH1 to CH8 have a cylindrical shape, side surfaces of the vertical channel layers CHD1 to CHD4, CHS1 to CHS4, and CH1 to CH8 surrounded by the conductive layers DSL1 to DSL4, SSL1 to SSL4, WLA0 to WLA31, and WLB0 to WLB31 may be round. When the vertical channel layers CHD1 to CHD4, CHS1 to CHS4, and CH1 to CH8 have a cylindrical shape, side surfaces of the vertical channel layers CHD1 to CHD4, CHS1 to CHS4, and CH1 to CH8 not surrounded by the conductive layers DSL1 to DSL4, SSL1 to SSL4, WLA0 to WLA31, and WLB0 to WLB31 may be flat.

In addition, the side surfaces of the vertical channel layers CHD1 to CHD4, CHS1 to CHS4, and CH1 to CH8 not surrounded by the conductive layers DSL1 to DSL4, SSL1 to SSL4, WLA0 to WLA31, and WLB0 to WLB31 may face each other. For example, the side surface of the first vertical channel layer CHD1/CH1 not surrounded by the first stacked conductive layers DSL1 and WLA31 to WLA16 may face the side surface of the second vertical channel layer CHD2/CH2 not surrounded by the second stacked conductive layers DSL2 and WLB31 to WLB16. The side surface of the third vertical channel layer CHS2/CH3 not surrounded by the third stacked conductive layers SSL2 and WLB15 to WLB0 may face the side surface of the fourth vertical channel layer CHS3/CH4 not surrounded by the fourth stacked conductive layers SSL3 and WLA15 to WLA0. The side surface of the fifth vertical channel layer CHD3/CH5 not surrounded by the fifth stacked conductive layers DSL3 and WLA31 to WLA15 may face the side surface of the sixth vertical channel layer CHD4/CH6 not surrounded by the sixth stacked conductive layers DSL4 and WLB31 to WLB16. The side surface of the seventh vertical channel layer CHS4/CH7 not surrounded by the seventh stacked conductive layers SSL4 and WLB15 to WLB0 may face the side surface of the eighth vertical channel layer CHS1/CH8 not surrounded by the eighth stacked conductive layers SSL1 and the WLA15 to WLA0.

As described above, after the conductive layers DSL1 to DSL4, SSL1 to SSL4, WLA0 to WLA31, and WLB0 to WLB31, the multilayer ONO, and vertical channel layers CHD1 to CHD4, CHS1 to CHS4, and CH1 to CH8 are formed, these conductive layers may be separated through an etch process before the bit line BL or the common source line SL formed, so that the number of memory strings and the number of memory cells may be doubled. Therefore, more memory cells may be formed within a predetermined area.

Figure 13:
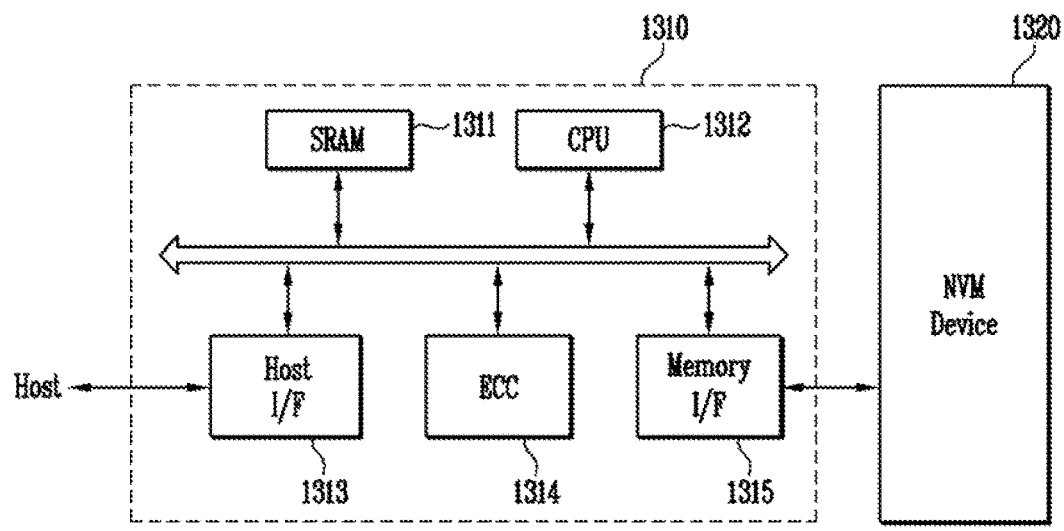
FIG. 13 is a block diagram illustrating a memory system according to an embodiment of the present invention.

FIG. 13 is a block diagram illustrating memory system according to an embodiment of the present invention.

Referring to FIG. 13, a memory system 1300 according to an embodiment of the present invention may include a non-volatile memory device 1320 and a memory controller 1310.

The non-volatile memory device 1320 may include the above-described semiconductor device, so that the memory system 1400 may include more memory cells to increase data storage capacity or reduce the size of the system.

The memory controller 1310 may include a static random access memory device (SRAM) 1311, a central processing unit (CPU) 1312, a host interface 1313, an error correcting code unit (ECC) 1314, and a memory interface 1315. The memory controller 1310 may be configured to control the non-volatile memory device 1320. The memory system 1300 may be a solid state disk (SSD) or a memory card in which the non-volatile memory device 1320 and the memory controller 1310 are combined. The SRAM 1311 may be used as an operation memory of the CPU 1312. The host interface 1313 may include a data exchange protocol of a host coupled to the memory system 1300. In addition, the ECC 1314 may detect and correct errors included in data read from the non-volatile memory device 1320. The memory interface 1315 may operate to interface with the non-volatile memory device 1320. The central processing unit 1312 may perform the general control operations for data exchange of the memory controller 1310.

Though not shown in FIG. 13, the memory controller 1310 may further include ROM (not illustrated) that stores code data to interface with the host. The non-volatile memory device 1320 may be a multi-chip package composed of a plurality of flash memory chips. The non-volatile memory device 1320 may be provided as a storage medium having error rate and high reliability. In particular, a memory system such as a Solid State Disk (SSD), on which research has been actively carried out, may include a flash memory device according to an embodiment of the present invention. The memory controller 1310 may be configured to communicate with an external device (e.g., a host) through one of the interface protocols including USB, MMC, PCI-E, SATA, PATA, SCSI, ESDI, and IDE.

Figure 14:
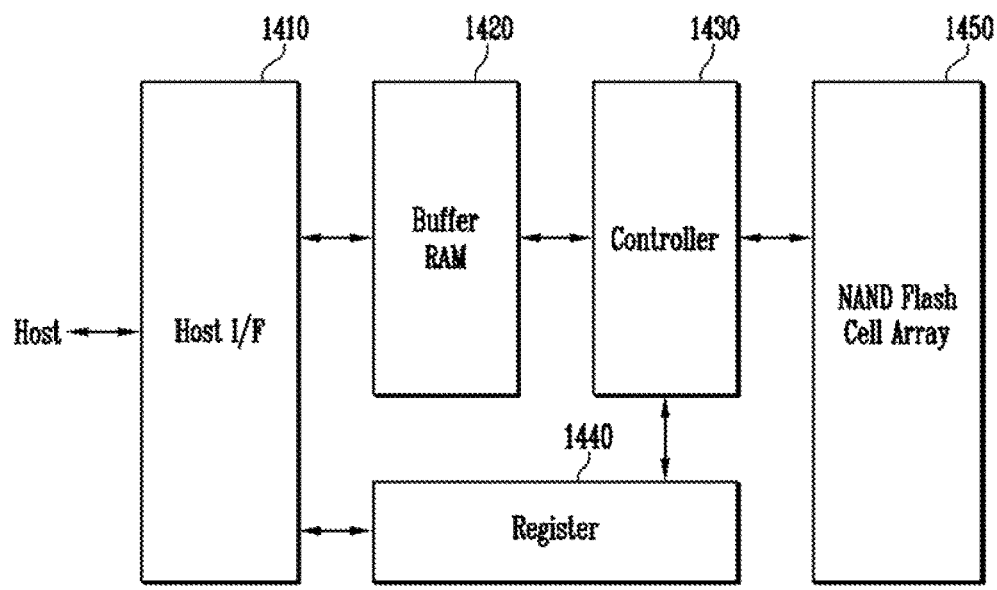
FIG. 14 is a block diagram illustrating a fusion memory device or a fusion memory system performing a program operation according to the various embodiments.

FIG. 14 is a block diagram illustrating a fusion memory device or a fusion memory system configured to perform a program operation according to the aforementioned various embodiments. For example, the technical features of the present invention may be used in a OneNAND flash memory device 1400 as a fusion memory device.

The OneNAND flash memory device 1400 may include may include a host interface (I/F) 1410, a buffer RAM 1420, a controller 1430, a register 1440 and a NAND flash cell array 1450. The host interface 1410 may be configured to exchange various types of information with an external device through a different protocol. The buffer RAM 1420 may have built-in codes for driving the memory device or temporarily storing data. The controller 1430 may be configured to control read and program operations at every state in response to a control signal and a command that are externally given. The register 1440 may be configured to store data including instructions, addresses and configurations defining a system operating environment in the memory device. The NAND flash cell array 1450 may include the memory array described with reference to FIG. 3, 7 or 10. Therefore, the OneNAND flash memory device 1400 may include more memory cells to increase data storage capacitor or reduce the size of the system.

Figure 15:
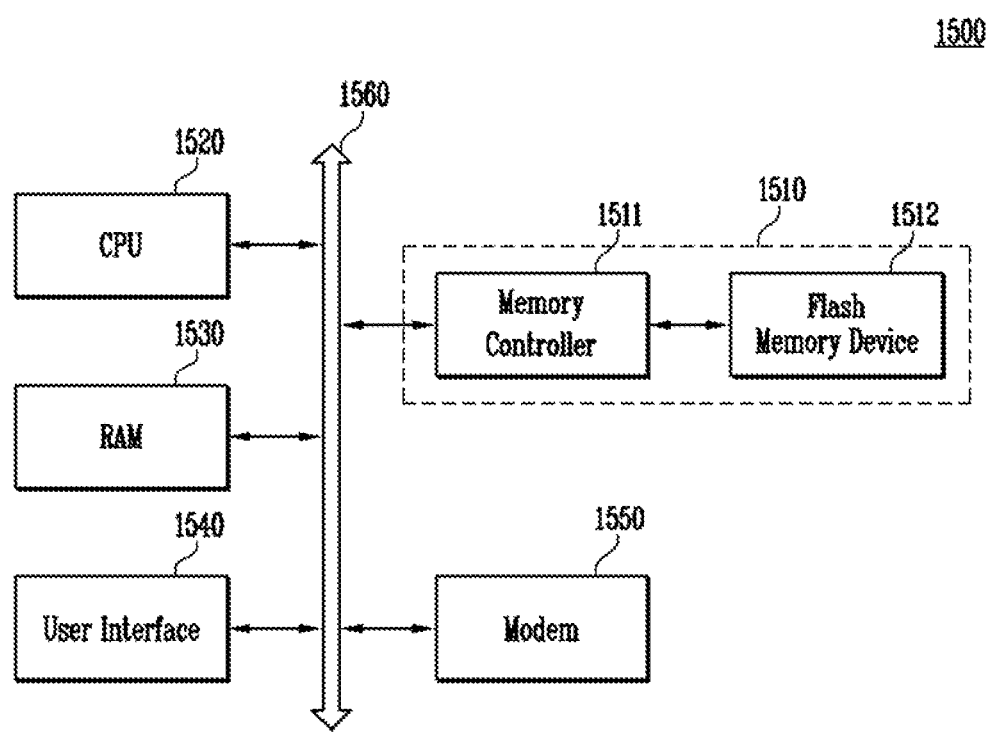
FIG. 15 is a block diagram illustrating a computing system including flash memory device according to an embodiment of the present invention.

FIG. 15 is a block diagram illustrating a computing system including a flash memory device 1512 according to an embodiment of the present invention.

A computing system 1500 according to an embodiment of the present invention may include a microprocessor (CPU) 1520, a RAM 1530, a user interface 1540, a modem 1550, such as a baseband chipset, and a memory system 1510 that are electrically coupled to a system bus 1560. In addition, if the computing system 1500 is a mobile device, then a battery may be provided to apply an operating voltage to the computing system 1500. Though not shown in FIG. 15, the computing system 1500 may further include application chipsets, a Camera Image Processor (CIS), or +mobile DRAM. For example, the memory system 1500 may form a Solid State Drive/Disk (SSD) that uses the above-described semiconductor device to store data. In another example, the memory system 1500 may be provided as a fusion flash memory (e.g., OneNAND flash memory).

According to an embodiment of the present invention, more memory cells may be formed in a predetermined area.

What is claimed is:

1. A semiconductor device, comprising:
   first, second, fifth and sixth vertical channel layers vertically coupled between a semiconductor substrate and a bit line;
   third, fourth, seventh and eighth vertical channel layers vertically coupled between the semiconductor substrate and a common source line;
   first, third, fifth and seventh multilayer conductive layers stacked on the semiconductor substrate at predetermined distances to surround one side of the first, third, fifth and seventh vertical channel layers, respectively;
   second, fourth, sixth and eighth multilayer conductive layers stacked on the semiconductor substrate at predetermined distances to surround one side of the second, fourth, sixth and eighth vertical channel layers, respectively;
   a first pipe channel layer formed in the semiconductor substrate to couple lower portions of the first and eighth vertical channel layers;
   a second pipe channel layer formed in the semiconductor substrate to couple lower portions of the second and third vertical channel layers;
   a third pipe channel layer formed in the semiconductor substrate to couple lower portions of the fourth and fifth vertical channel layers; and
   a fourth pipe channel layer formed in the semiconductor substrate to couple lower portions of the sixth and seventh vertical channel layers,
   wherein one side of the first, second, third, fourth, fifth, sixth, seventh and eighth vertical channel layers surrounded by the first, second, third, fourth, fifth, sixth, seventh and eighth multilayer conductive layers are round, while an opposite side to the one side of the first, second, third, fourth, fifth, sixth, seventh and eighth vertical channel layers are flat, and
   wherein the first vertical channel layer and the second vertical channel layer form a single semiconductive pillar.

2. The semiconductor device of claim 1,
   wherein an opposite side to one side of the first vertical channel layer and an opposite side to one side of the second vertical channel layer face each other,
   an opposite side to one side of the third vertical channel layer and an opposite side to one side of the fourth vertical channel layer face each other,
   an opposite side to one side of the fifth vertical channel layer and an opposite side to one side of the sixth vertical channel layer face each other, and
   an opposite side to one side of the seventh vertical channel layer and an opposite side to one side of the eighth vertical channel layer face each other.

3. The semiconductor device of claim 1, wherein other conductive layers than uppermost conductive layers of the first to eighth multilayer conductive layers include word lines, and
   the word lines of the first, second, third, and fourth multilayer conductive layers are coupled to the word lines of the fifth, sixth, seventh, and eighth multilayer conductive layers, respectively, while the uppermost conductive layers of the first to eighth multilayer conductive layers are separate from each other.

4. The semiconductor device of claim 1, wherein the first to eighth vertical channel layers are sequentially arranged on the semiconductor substrate.

5. The semiconductor device of claim 1, wherein uppermost conductive layers of the first, second, fifth and sixth multilayer conductive layers include drain selection lines,
   uppermost conductive layers of the third, fourth, seventh and eighth multilayer conductive layers include source selection lines, and
   remaining conductive layers of the first to eighth multilayer conductive layers include word lines.

* * * * *